United States Patent [19]

Hshieh et al.

[11] Patent Number: 5,479,037
[45] Date of Patent: Dec. 26, 1995

[54] LOW THRESHOLD VOLTAGE EPITAXIAL DMOS TECHNOLOGY

[75] Inventors: Fwu-Iuan Hshieh, San Jose; Hamza Yilmaz, Saratoga; Mike Chang, Cupertino, all of Calif.

[73] Assignee: Siliconix Incorporated, Santa Clara, Calif.

[21] Appl. No.: 131,114

[22] Filed: Oct. 1, 1993

Related U.S. Application Data

[63] Continuation of Ser. No. 925,336, Aug. 4, 1992, abandoned.

[51] Int. Cl.$^6$ .............................. H01L 29/10; H01L 29/78
[52] U.S. Cl. ..................... 257/328; 257/335; 257/339; 257/341
[58] Field of Search ................................ 257/328, 335, 257/339, 341, 342

[56] References Cited

U.S. PATENT DOCUMENTS

| | | |
|---|---|---|
| 4,078,947 | 3/1978 | Johnson et al. . |
| 4,376,286 | 3/1983 | Lidow et al. . |
| 4,593,302 | 6/1986 | Lidow et al. . |
| 4,642,666 | 2/1987 | Lidow et al. . |
| 4,680,853 | 7/1987 | Lidow et al. . |
| 4,705,759 | 11/1987 | Lidow et al. . |
| 4,803,532 | 2/1989 | Mihara ................................. 257/328 |
| 4,959,699 | 9/1990 | Lidow et al. . |
| 5,008,725 | 4/1991 | Lidow et al. . |
| 5,016,066 | 5/1991 | Takahashi . |
| 5,138,422 | 8/1992 | Fujii et al. ................................. 357/49 |

FOREIGN PATENT DOCUMENTS

| | | |
|---|---|---|
| 0335750 | 10/1988 | European Pat. Off. . |
| 55-67161 | 5/1980 | Japan . |
| 7153469 | 9/1982 | Japan . |
| 57-188877 | 11/1982 | Japan . |
| 62-176168 | 8/1987 | Japan . |

OTHER PUBLICATIONS

Stanley Wolf et al., "Silicon Processing For The VLSI Era—vol. 1: Process Technology", Lattice Press, 1986, pp. 124–160.

Stanley Wolf, Ph.D., "Silicon Processing For The VLSI Era—vol. 2: Process Integration", Lattice Press, 1990, pp. 674–675.

*Primary Examiner*—Steven H. Loke
*Assistant Examiner*—Valencia Martin Wallace
*Attorney, Agent, or Firm*—Skjerven, Morrill, MacPherson, Franklin & Friel; Paul J. Winters; T. Lester Wallace

[57] ABSTRACT

A low threshold voltage power DMOS transistor structure is disclosed having a lightly doped channel region formed in a shallow layer of relatively lightly doped epitaxial silicon. The light doping of the shallow epitaxial layer minimizes variations in threshold voltage and local variations in punch-through susceptibility due to nonuniformities in epitaxial doping concentration. A relatively heavily doped epitaxial layer is disposed underneath the shallow lightly doped epitaxial layer to reduce the drain to source resistance, $R_{DS}$. Because the relatively heavily doped epitaxial layer is located below the channel region and not in the regions of the structure most susceptible to body region punch-through, providing the relatively highly doped epitaxial layer does not cause variations in threshold voltage and does not cause variations in the reverse bias voltage at which punch-through across the body region occurs.

7 Claims, 3 Drawing Sheets

LOW THRESHOLD VOLTAGE EPITAXIAL DMOS TECHNOLOGY

This application is a continuation of application Ser. No. 07/925,336, filed Aug. 4, 1992, now abandoned.

FIELD OF THE INVENTION

This invention relates to low threshold voltage DMOS transistor structures disposed in epitaxial silicon.

BACKGROUND OF THE INVENTION

FIG. 1 (PRIOR ART) is a cross-sectional simplified view of a portion of a double diffused metal oxide silicon (DMOS) transistor structure. An N- type epitaxial layer is disposed on an N+ type substrate 2. A P type body region 3 extends into the N- type epitaxial layer from the upper surface 4 of the N- type epitaxial layer to form an N-type epitaxial region 1. An N+ type source region 5 extends into the P type body region 3 from upper surface 4 so that a channel region 3A of the P type body region 3 exists between N+ source region 5 and the N- type epitaxial region 1 at upper surface 4. A gate 6 is disposed over the channel region 3A so that a layer of gate oxide 7 separates the gate 6 from the underlying N+ type source region 5, from the underlying P type channel region 3A, and from the underlying N- type epitaxial region 1. A source electrode S is shown connected to the source region, a gate electrode G is shown connected to the gate, and a drain electrode D is shown connected to the bottom surface of the substrate.

In operation, a positive voltage on gate 6 having a magnitude equal to or greater than a threshold voltage causes channel region 3A to invert, therefore allowing current to travel in a current path from drain electrode D, through N+ substrate 2, through N- type epitaxial region 1, through the inverted channel region 3A, through N+ type source region 5, and to source electrode S. Current flowing in this current path experiences a resistance $R_{DS}$. As indicated in FIG. 1, resistance $R_{DS}$ to a first approximation is comprised of the resistance through the epitaxial region $R_{EPI}$, the resistances $R_{JFET}$ and $R_{ACC}$ through the epitaxial silicon between adjacent P type body regions, and the resistance across the channel region In many applications, including applications in which the DMOS power transistors are controlled by low voltage digital logic transistors, DMOS transistors having low threshold voltages are desired. Reducing the threshold voltage at which the channel region will invert may be accomplished in several ways including providing a body region 3 which is less heavily doped. If body region 3 is less heavily doped, a smaller positive voltage on gate 6 will be adequate to drive the smaller number of holes in channel region 3A out of the channel region and to invert the channel region.

It is, however, also a concern in DMOS transistors to reduce the source to drain resistance $R_{DS}$. $R_{DS}$ may be decreased, for example, by increasing the N type dopant concentration of the epitaxial layer thereby making epitaxial region 1 more conductive and thereby reducing the $R_{EPI}$, $R_{JFET}$ and $R_{ACC}$ components of $R_{DS}$. FIG. 2 represents the dopant concentration of N and P type dopants at the upper surface 4 of the structure shown in FIG. 1. Because the P type body region 3 is formed into the N- type epitaxial layer, P type body region 3 has a background N type doping at the same concentration as epitaxial region 1. Similarly, because source region 5 is formed into P type body region 3, source region 5 is doped with P type dopants to the same concentration that channel region 3A is doped and is also doped with N type dopants to the same concentration as epitaxial region 1 is doped.

When the threshold voltage of the DMOS transistor is to be reduced by reducing the doping of the P type body region 3, the concentration of P type dopants in body region 3 has a concentration of a relatively low level such as the P type body concentration level 20 shown in FIG. 2. It is still desired, however, that the $R_{DS}$ of the DMOS transistor be as small as possible. The $R_{DS}$ of the device often cannot, however, be reduced as much as desired due to irregularities in the concentration of N type dopants in different regions of the epitaxial layer.

Body region 3 and source region 5 are typically formed by ion implantation. Implantation can be performed so that a fairly uniform dopant concentration is implanted. The growing of doped epitaxial silicon, in contrast, results in a concentration of dopants in the epitaxial silicon that may vary from region to region throughout the epitaxial layer. Epitaxial silicon grown in a batch reactor may have a dopant concentration that varies throughout a range of plus or minus approximately ten percent. Epitaxial silicon grown in a single wafer reactor may have a dopant concentration that varies throughout a range of plus or minus approximately five percent. These variations in dopant concentration may exist from transistor to transistor on the same wafer or may exist from wafer to wafer.

Accordingly, if the N type dopant concentration of the epitaxial region 1 (see level 21 in FIG. 2) is increased to where it is a significant proportion of the concentration of P type dopants of body region 3, local variations in epitaxial N- type dopant concentration will become a significant proportion of the total dopant concentration of the body region 3. As a result, irregularities in the doping concentration in the P body region 3 due to local epitaxial doping nonuniformities result in unpredictable depletion contours where the reverse biased PN junction between the P type body region 3 and the N- type epitaxial region 1 depletes inward toward the source region. A P type body region formed into a more heavily N doped portion of epitaxial region 1 will deplete inwards a farther distance toward the source region for a given PN junction reverse bias voltage than a similar P type body region disposed in a less highly N doped portion of epitaxial region 1. Because the body region is to withstand a given reverse bias without suffering punch-through, the P type doping of all the body regions throughout the wafer may have to be increased to prevent P body regions disposed in localized areas of more highly doped epitaxial silicon from punching through under the given reverse bias.

The variable doping concentration of various regions of the epitaxial layer may also result in the voltage threshold of one DMOS device on a wafer having a first threshold voltage whereas a second DMOS transistor formed in a different region of epitaxial silicon on the wafer or on another wafer has a second threshold voltage. Because the threshold voltages of the DMOS transistors must be fairly uniform for all DMOS transistors, conventional low threshold voltage DMOS devices typically employ relatively large areas of epitaxial silicon between adjacent P body regions in order to reduce $R_{JFET}$, $R_{ACC}$ and $R_{EPI}$ by providing more silicon in the $R_{DS}$ current path. A large amount of silicon may therefore be consumed in conventional low threshold voltage DMOS structures to reduce $R_{DS}$ while maintaining a uniform low threshold voltage.

SUMMARY OF THE INVENTION

A low threshold voltage DMOS device is disclosed having a channel region disposed in a shallow relatively lightly doped epitaxial layer. The light doping of the shallow epitaxial layer minimizes the magnitude of the range of dopant concentration in the shallow epitaxial silicon. Accordingly, localized variations in threshold voltage are minimized and localized variations in depletion contours caused by localized nonuniformities in the epitaxial doping concentration are also minimized.

To reduce $R_{DS}$, however, the shallow lightly doped epitaxial layer is disposed on a relatively heavily doped epitaxial layer. Because the relatively heavily doped epitaxial layer is located below the channel region and not in the regions most susceptible to punch-through, providing the relatively highly doped epitaxial layer does not cause variations in the threshold voltage and does not cause variations in the reverse bias voltage at which punch-through occurs through the body region. The relatively heavily doped epitaxial layer extends from the bottom of the shallow lightly doped epitaxial layer down to the top of an underlying heavily doped substrate layer.

The shallow lightly doped epitaxial layer may be formed in at least two ways: 1) a shallow surface layer of a relatively highly doped epitaxial layer may be counterdoped by ion implantation to form a less lightly doped surface shallow layer over an underlying relatively heavily doped layer, and/or 2) a shallow relatively lightly doped epitaxial layer may be grown over an underlying relatively heavily doped epitaxial layer.

Accordingly, the relatively large amount of silicon required in conventional low threshold DMOS structures to reduce $R_{DS}$ while maintaining a uniform low threshold voltage can be reduced by employing the present invention. The present invention therefore may allow smaller die sizes for low threshold voltage DMOS devices resulting in significant cost reductions as well as more uniform threshold voltage.

DETAILED DESCRIPTION OF THE INVENTION

Figure 1:
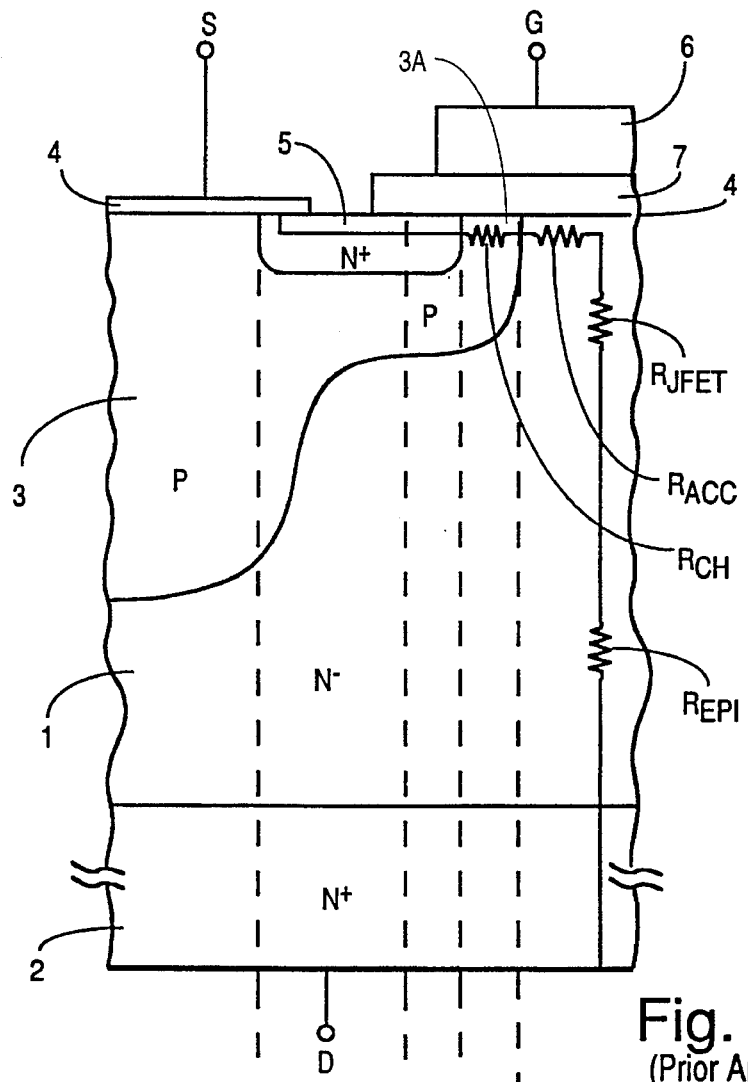
FIG. 1 (PRIOR ART) is a cross-sectional simplified view of a potion of a conventional vertical DMOS transistor structure.
Figure 2:
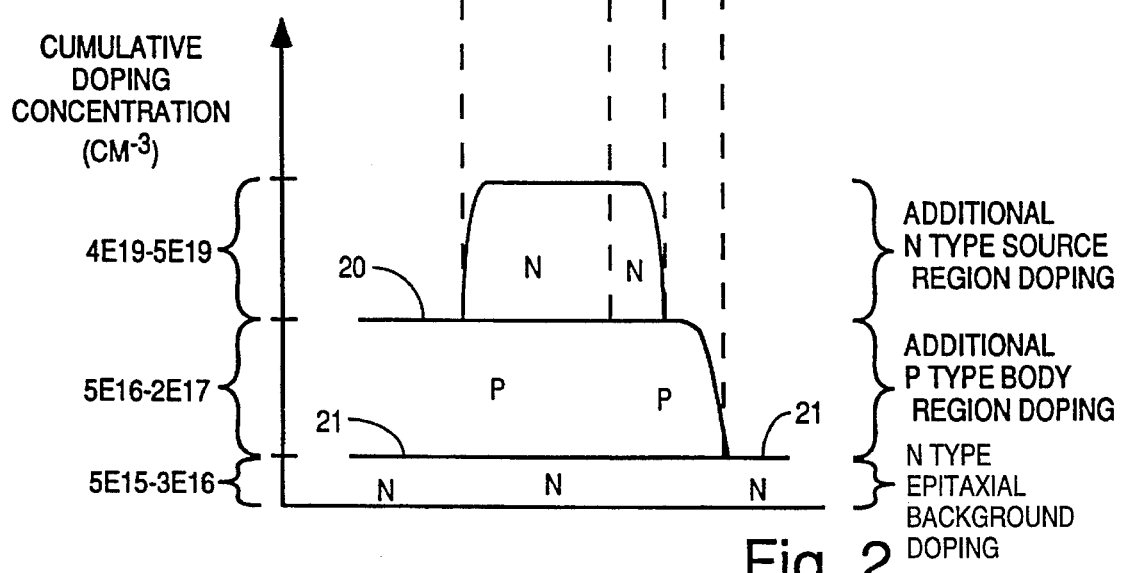
FIG. 2 (PRIOR ART) is a graph depicting the relative doping concentrations of various regions in the simplified structure of FIG. 1.
Figure 3:
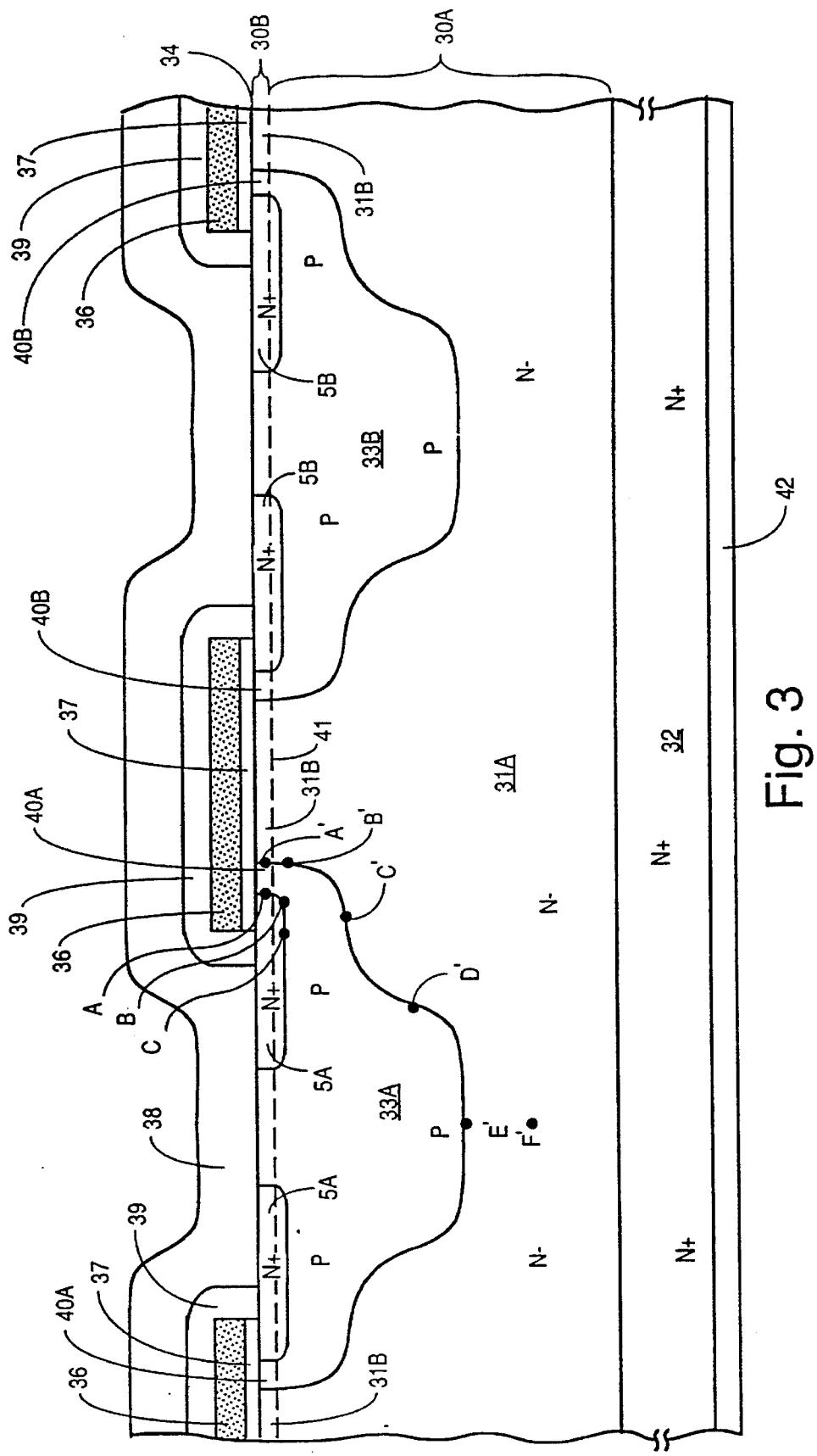
FIG 3 is a cross-sectional view of a first embodiment of a low threshold vertical DMOS transistor structure according to the present invention.

FIG. 3 is a cross-sectional view of a low threshold DMOS transistor structure according to the present invention. An N- type epitaxial layer 30A is disposed on a N+ type substrate 32. A shallow N- type epitaxial layer 30B which is less doped with N type dopants than layer 30A is disposed directly on layer 30A. A first P type body region 33A and a second P type body region 33B extend into the two epitaxial layers 30A and 30B from an upper surface 34 of the shallow epitaxial layer. An N- type epitaxial region 31A is therefore formed so that it is partially laterally disposed around body regions 33A and 33B and so that a shallow N- type epitaxial region 31B is formed between adjacent P type body regions. From a top down perspective, shallow N- type epitaxial region 31B may have a lattice mesh-shaped form. In other embodiments, it may have a comb-like form. The dashed line 41 in FIG. 3 extends through the body regions 33A and 33B as well as through the source regions 5A and 5B to indicate that the N- type doping of the lightly doped epitaxial layer 30B also serves as a background doping of a surface layer of body regions 33A and 33B.

An N+ type source region 5A extends into P type body region 33A from upper surface 34 so that a channel region 40A of the P type body region 33A exists between N+ source region 5A and N- type shallow epitaxial layer region 31B. Similarly, an N+ type source region 5B extends into P type body region 33B from upper surface 34 so that a channel region 40B of the P type body region 33B exists between N+ source region 5B and N- type shallow epitaxial layer region 31B.

A polysilicon gate structure 36 is disposed over the channel regions 40A and 40B so that a layer of gate oxide 37 separates the gate 36 from the underlying source regions 5A and 5B, from the underlying channel regions 40A and 40B, and from the underlying shallow lightly doped epitaxial region 31B. A metal source electrode 38 is disposed over the structure so that source electrode 38 is insulated from gate 36 by an insulating layer 39 and so that source electrode 38 contacts source regions 5A and 5B and P type body regions 33A and 33B. A metal drain electrode 42 is disposed on a bottom surface of substrate 32.

Figure 4:
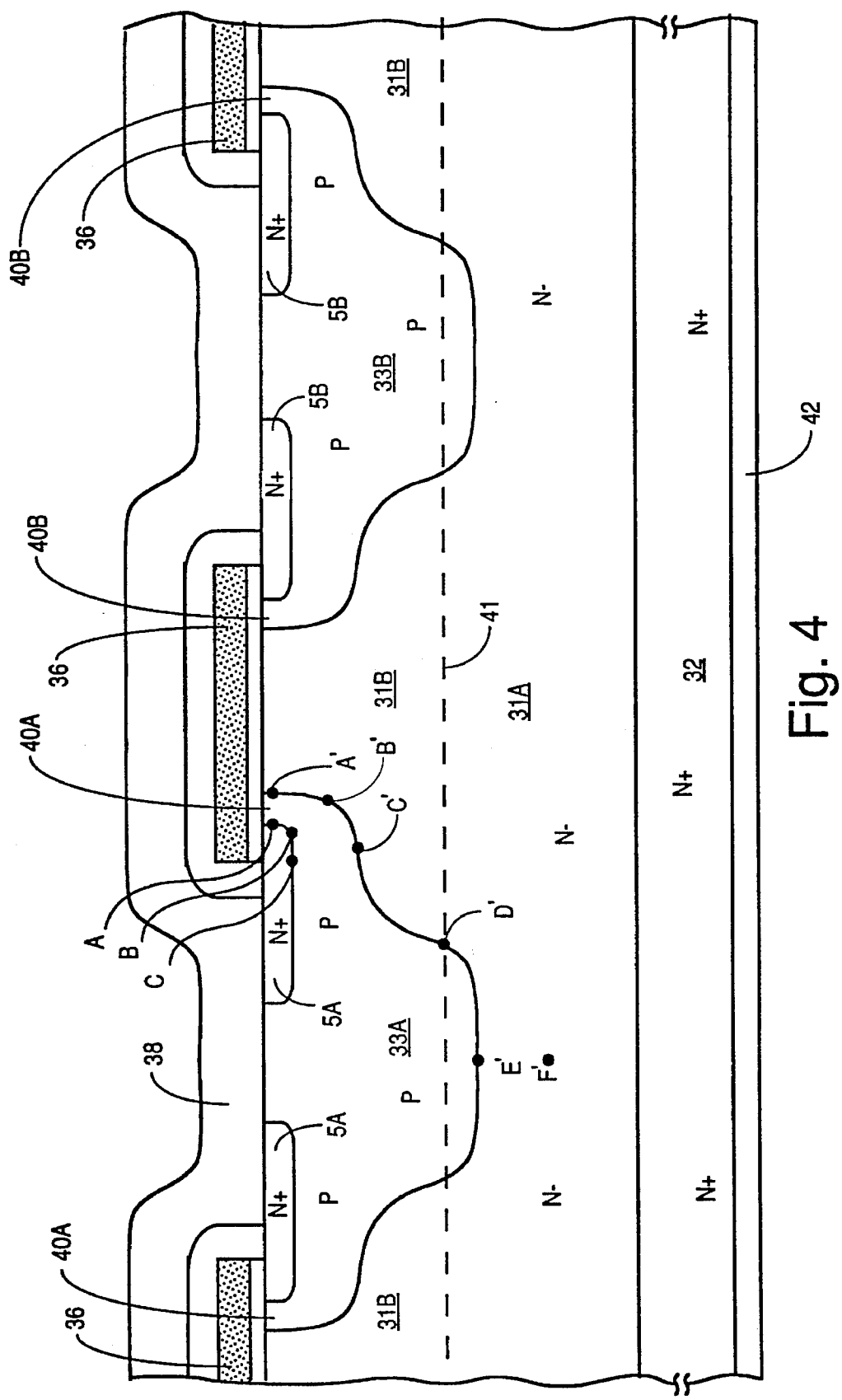
FIG 4 is a cross-sectional view of a second embodiment of a low threshold vertical DMOS transistor structure according to the present invention.

In the embodiment shown in FIG. 3, body region 33A and source region 5A are formed so that the distance from the PN junction between N- type epitaxial region 31A and P type body region 33A is smaller between points A and A' than it is between points B and B' and between points C and C'. Punch-through under reverse bias conditions is therefore most likely to occur first in the portion of P type body region 33A that is thinnest. Accordingly, lightly doped epitaxial region 31B may, in some embodiments, be a shallow surface region which is only thick enough to include this thinnest portion of the body region between points A and A'. Punch-through, however, may occur elsewhere in the body region. In other embodiments, the N- type epitaxial region 31B may extend deeper from upper surface 34 so that source regions 5A and 5B are entirely disposed in shallow lightly doped epitaxial layer 30B. In still other embodiments, the epitaxial region 31B extends still deeper so that, for example, points C', D', E' or F' are on the bottom surface of epitaxial layer 30B in each of the respective embodiments. FIG. 4, for example, is a cross-sectional view of an embodiment of the present invention wherein shallow epitaxial region 31B extends down to the depth of point D'.

The structure of the present invention can be realized by an implant method. According to this method, an N type epitaxial layer is grown on an substrate such as an N+ type substrate. This N type epitaxial layer may, for example, be grown in a barrel reactor, in an atmosphere of 98% $H_2$ and 2% $SiHCl_3$ and $PH_3$, at a temperature of 1,150° Celsius for 5–18 minutes, until it is 5–18 μm thick, and has an N type doping concentration which varies within a range of 6E15 to 6E16 ions/cm$^3$. A shallow epitaxial layer is then formed by ion implanting (Boron) P type ions into the upper surface of the epitaxial layer at an implant energy of 40 KeV with a dose of 1.0E12–2.0E12 cm$^{-2}$ so that boron ions are implanted to a depth of 0.14 μm. A gate oxide layer may then be thermally grown at a temperature of 1000°–1050° Celsius for 20–40 minutes over the upper surface of the epitaxial layer so that the implanted P type ions are diffused into the N type epitaxial layer to form a shallow N- type lightly doped epitaxial layer having a depth of approximately 0.5–1.0 μm.

The structure of the present invention can also be realized by a double epitaxial formation method. An N type epitaxial layer is grown on an substrate such as an N+ type substrate. As described above, this epitaxial layer may, for example, be grown in a barrel reactor, in an atmosphere of 98% $H_2$ and 2% $SiHCl_3$ and $AsH_3$, at a temperature of 1,150° Celsius, for 4–17 minutes, until it is 4–17 μm thick, and has an N type doping concentration which varies within a range of 6E15 to 6E16 ions/cm$^3$. A shallow relatively lightly doped N- type epitaxial layer is then grown over the underlying epitaxial layer. This shallow N- type epitaxial layer may, for example, be grown in a barrel reactor, in an atmosphere of 98% $H_2$ and 2% Arsine gas and trichlorsilane, at a temperature of 1,150° Celsius, for 1–2 minutes, until it is 1–2 μm thick, and has an N type doping concentration which varies with a range of 4E15 to 1E16 ions/cm$^3$. By using Arsine gas, outdiffusion in subsequent temperature cycles is minimized.

In either the double epitaxial formation method or in the ion implantation method, a P-type body region is implanted. A gate of polysilicon may be used as an implant mask so that the resulting P-type body region is self-aligned with the polysilicon gate. With the doping concentrations given above for the shallow epitaxial layer and the underlying epitaxial layer, the resultant P-type body region may be doped with Boron P-type dopants to a dose of approximately 6E13–1.2E14 ions/cm$^2$.

The double epitaxial formation method results in a smaller range of doping concentration nonuniformities in the shallow epitaxial layer than does the ion implantation method. In the ion implantation method, the epitaxial silicon in shallow layer is grown with a relatively high dopant concentration. This silicon therefore has a relatively large range of dopant concentration nonuniformity. Reducing the overall dopant concentration of the shallow layer by ion implanting with opposite type dopants does not result in the relatively smaller range of dopant concentration nonuniformities realized when the epitaxial silicon of the shallow region is grown with an initial low dopant concentration.

Although the present invention has been described in connection with various specific illustrative embodiments, the present invention is not to be limited thereto. The present invention may, for example, be applied to N channel devices by utilizing P type epitaxial layers. No specific manufacturing equipment is required to practice the invention. Various adaptations and modifications of the described specific embodiments are considered to be within the scope of the claimed invention as set forth in the appended claims.

We claim:

1. A vertical power MOS transistor structure, comprising:

a substrate layer;

a relatively heavily doped epitaxial layer disposed directly on said substrate layer, said relatively heavily doped epitaxial layer being of a first conductivity type and having a redistribution layer and another layer disposed over said redistribution layer, said another layer having a substantially constant first doping concentration of said first conductivity type, said relatively heavily doped epitaxial layer having been grown with said first doping concentration;

a relatively lightly doped epitaxial layer disposed directly on said relatively heavily doped epitaxial layer, said relatively lightly doped epitaxial layer being of said first conductivity type, said relatively lightly doped epitaxial layer having an upper surface, said relatively lightly doped epitaxial layer having a second doping concentration of said first conductivity type, said second doping concentration being smaller than said first doping concentration, said relatively lightly doped epitaxial layer having been grown with said second doping concentration;

a body region extending through said relatively lightly doped epitaxial layer from said upper surface and into said relatively heavily doped epitaxial layer, said body region being of a second conductivity type opposite said first conductivity type;

a source region disposed in said body region to define a channel region in said relatively lightly doped epitaxial layer at said upper surface, said source region being of said first conductivity type;

a gate insulating layer disposed directly on said upper surface; and a gate, disposed at least partly over said channel region and being insulated from said channel region by said gate insulating layer.

2. The vertical power MOS transistor structure of claim 1, wherein said body region has a doping concentration of dopants of said second conductivity type, said doping concentration of said body region being substantially greater than said second doping concentration of said relatively lightly doped epitaxial layer.

3. The vertical power MOS transistor structure of claim 2, wherein said doping concentration of said body region is substantially equal to said first doping concentration of said another layer of said relatively heavily doped epitaxial layer.

4. The vertical power MOS transistor structure of claim 1, wherein a portion of said source region abuts said channel region and wherein said portion of said source region is disposed only within said relatively lightly doped epitaxial layer.

5. The vertical power MOS transistor structure of claim 4, wherein said source region is disposed only with said relatively lightly doped epitaxial layer.

6. The vertical power MOS transistor structure of claim 1, wherein a portion of said source region extends downward into said relatively heavily doped epitaxial layer.

7. A doubly diffused vertical power MOS transistor structure, comprising:

a substrate layer;

a first epitaxial silicon layer disposed directly on said substrate layer and having a redistribution layer and another layer disposed over said redistribution layer, said another layer having a substantially constant first doping concentration of N type dopants, said first epitaxial silicon layer being grown having said first doping concentration of N type dopants;

a second epitaxial silicon layer disposed directly on said first epitaxial layer, said second epitaxial silicon layer being grown having a second doping concentration of N type dopants, said second epitaxial layer having an upper surface, said first doping concentration being greater than said second doping concentration;

a P type body region extending from said upper surface through said second epitaxial silicon layer and into said first epitaxial silicon layer to define an epitaxial silicon region of said first epitaxial silicon layer, said P type body region defining a first lateral outer perimeter of said P type body region and defining a second lateral outer perimeter of said P type body region, said first and second lateral outer perimeters being disposed in respective lateral planes parallel to each other, said lateral plane containing said first lateral outer perimeter being disposed farther from said upper surface than said second lateral outer perimeter, said first and second planes being substantially parallel to said upper surface, said second lateral outer perimeter having a greater outer circumference than said first lateral outer perimeter, said first and second lateral outer perimeters both being disposed in said second epitaxial layer;

an N type source region disposed in said body region and being disposed entirely within said second epitaxial silicon layer, said N type source region defining a minimum distance between said N type source region and said epitaxial silicon region of said first epitaxial silicon layer, said minimum distance extending in a direction somewhat laterally away from said N type source region;

a gate insulating layer disposed directly on said upper surface; and a gate disposed at least partly over said gate insulating layer.

* * * * *

UNITED STATES PATENT AND TRADEMARK OFFICE
CERTIFICATE OF CORRECTION

PATENT NO. : 5,479,037
DATED : December 26, 1995
INVENTOR(S) : Hshieh, et. al.

It is certified that error appears in the above-indentified patent and that said Letters Patent is hereby corrected as shown below:

Column 6, line 39, delete "with" and insert -- within--.

Signed and Sealed this

Twenty-second Day of October, 1996

Attest:

BRUCE LEHMAN

*Attesting Officer*   *Commissioner of Patents and Trademarks*